United States Patent [19]

Liang

[11] Patent Number: 5,726,874
[45] Date of Patent: Mar. 10, 1998

[54] POWER SUPPLY HAVING A DUAL AIR FLOW CONTROL FOR REDUCING HEAT BUILDUP

[76] Inventor: Charles Liang, 3086 Balmoral Dr., San Jose, Calif. 95132

[21] Appl. No.: 746,550

[22] Filed: Nov. 13, 1996

[51] Int. Cl.⁶ ............................... H02M 5/42; H05K 7/20
[52] U.S. Cl. ................................... 363/141; 361/695
[58] Field of Search ........................... 363/141; 361/695

[56] References Cited

U.S. PATENT DOCUMENTS

| | | | |
|---|---|---|---|
| 4,691,274 | 9/1987 | Matouk et al. | 363/141 |
| 4,756,473 | 7/1988 | Takemae et al. | 236/49.3 |
| 4,931,904 | 6/1990 | Yiu | 361/695 |
| 5,170,336 | 12/1992 | Getter et al. | 363/141 |
| 5,546,272 | 8/1996 | Moss et al. | 361/687 |
| 5,572,403 | 11/1996 | Mills | 361/695 |

*Primary Examiner*—Stuart N. Hecker
*Attorney, Agent, or Firm*—Jeing & Chang

[57] ABSTRACT

The present invention relates to a power supply system which can provide a dual air flow control and heat reduction in an electronic device having a regular fan. The power supply system has an additional backup fan operating independently from the regular fan and further comprises a thermal control circuit comprising a solid state temperature sensor for detecting ambient temperature changes inside the electronic device and a fan power drive electrically connected to the solid state temperature sensor as well as to the backup fan to turn on or off the backup fan in response to ambient temperature changes. The power supply system also comprises a pair of resistors connected respectively to the solid state temperature sensor to set a low and a high trigger temperatures based that the backup fan is able to make a proper response to ambient temperature changes provided, however, that the high trigger temperature shall be higher than the low trigger temperature.

16 Claims, 4 Drawing Sheets

POWER SUPPLY HAVING A DUAL AIR FLOW CONTROL FOR REDUCING HEAT BUILDUP

FIELD OF INVENTION

This invention relates to an apparatus for controlling air flow and heat reduction for or inside an electrical device including, but without limitation to, a computer. More particularly, it relates to a power supply having a thermal control circuit which will automatically detect ambient temperature changes and activate a backup fan to reduce heat buildup inside an electronic device or the computer.

BACKGROUND OF THE INVENTION

An electronic device such as a computer system generally contains many IC components, whenever it powered on, heat is generated from the operation of these components. The heat continues to be generated as long as the computer system is in operation. As the heat begins to build up, the temperature of a resistive element starts to rise until such heat can find a flow path carded away from the element. If the heat flow path is poor, the temperature may continue to rise until the resistive element is destroyed, causing malfunction of the IC components.

Since many of such IC components are rapidly shrinking in size while their complexity and capability continue to grow at an amazing rate, this has produced a dramatic increase in the power density, resulting in rapid rising of temperatures and a large increase in the number of system failures.

Heat build-up inside a personal computer system is always a significant concern, especially for the personal computer system with high clock speed CPU, which has many high density IC components that may generate more heat during operation. A typical personal computer system usually includes a fan and a fan drive circuit to reduce heat build-up within the system. While the computer was in operation, the fan will draw hot air out of the system, reducing the heat build-up and keeping the temperate in the computer system low. Since the fan consumes lot of powers, this is becoming another concern.

One prior art scheme for controlling the power consumption of the fan is to have a standby mode and a normal operation mode for the CPU of the computer system, while in the normal operation mode, a temperature sensing device will detect current temperature and control the speed of the fan to compensate for ambient temperature differences. If the CPU did not need full operation, it will be put into the standby mode and does not generate much heat, so the fan may reduce speed or even power off to save energy. One disadvantage of such prior art one fan computer system is that sometimes heat build-up in the computer system is too much and too rapid such that the fan cannot reduce the fast buildup of heat so as to avoid IC malfunction. In addition, the one fan computer system may cause permanent damage to IC drives if the fan becomes malfunction with or without notices to users.

There is therefore an apparent need for a power supply system comprising two fans, one used as a regular fan and the other as a backup whose function is controlled by a thermal control circuit or a temperature sensor that is sensitive to the changes of ambient temperature and is capable of making proper responses to such temperature changes for prevention of any heat buildup in an electronic device or a computer system.

SUMMARY OF THE INVENTION

One object of the present invention is to provide a power supply system which can provide a dual air flow control and heat reduction in an electronic device having a regular fan. The power supply system has an additional backup fan operated independently from the regular fan and further comprises a thermal control circuit comprising a solid state temperature sensor for detecting ambient temperature changes inside the electronic device; a fan power drive electrically connected to the solid state temperature sensor and to the backup fan to turn on or off the backup fan in response to ambient temperature changes. The power supply system also comprises a pair of resistors connected respectively to the solid state temperature sensor to set a low and a high trigger temperatures based which the backup fan is able to make a proper response to ambient temperature changes provided, however, that the high trigger temperature shall be higher than the low trigger temperature. The solid state temperature sensor of the power supply system provided by the invention may further comprise an on-board positive temperature coefficient thermal sensor for detecting an internal temperature change of a die which may be installed inside the electric device. Preferably, the lower trigger temperature for the power supply system is around 45° C. and the high trigger temperature has a range between 50° and 70° C.

Another object of the invention is to provide for a thermal control circuit of a power supply system for controlling the operation of a fan in an electronic device in response to ambient temperature changes. Briefly, the thermal control circuit comprises a solid state temperature sensor for detecting ambient temperature changes and a fan power drive electrically connected to the solid state temperature sensor and to the fan to turn on or off the fan in response to ambient temperature changes. The thermal control circuit further comprises a pair of resistors connected respectively to the solid state temperature sensor to set a low and a high trigger temperatures based which the fan makes a proper response in accordance with ambient temperature changes provided, however, that the high trigger temperature shall be higher than the low trigger temperature.

One more object of the invention is to provide for a method for reducing heat buildup inside an electronic device having a conventionally installed regular fan. The method comprises the steps of installing a backup fan on a circuit board of the electronic device to provide for an additional air flow to prevent heat buildup. The backup fan is connected with a thermal control circuit comprising a solid state temperature sensor for detecting ambient temperature changes. The solid state temperature sensor is further connected to a fan power drive which will turn on or off the backup fan in response to ambient temperature changes. The method also comprises a step of connecting the solid state temperature sensor to a pair of resistors to set a low and a high trigger temperatures based which the fan power drive will be activated or deactivated to turn on or off the backup fan in accordance with ambient temperature changes.

Still one more object of the invention is to provide for a power supply system which can be suitably used in an electronic device to reduce heat buildup resulting from its operation such as in a computer system.

The foregoing objects and specific construction of the present invention will become apparent and understandable from the following detailed description thereof, when read in conjunction with the accompanying drawings.

DETAILED DESCRIPTION

Figure 1:
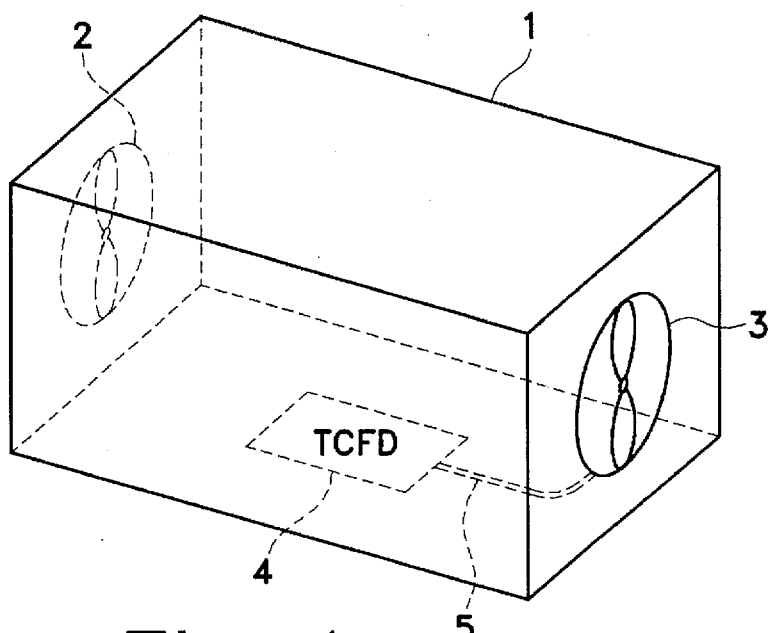
FIG. 1 shows a power supply system including a regular fan, a backup fan with temperature controlled fan driver on the board of the system.

Referring to FIG. 1, there is shown a power supply system 1 having a dual fan system in which a first fan or a regular fan 2 is conventionally installed on the box of the power supply system 1, and a second fan or a backup fan 3 electrically connects with a temperature controlled fan driver (hereinafter referred to as "TCFD") 4 which is mounted on a board 5 inside the power supply system 1 or inside a computer system (not shown here).

Figure 2:
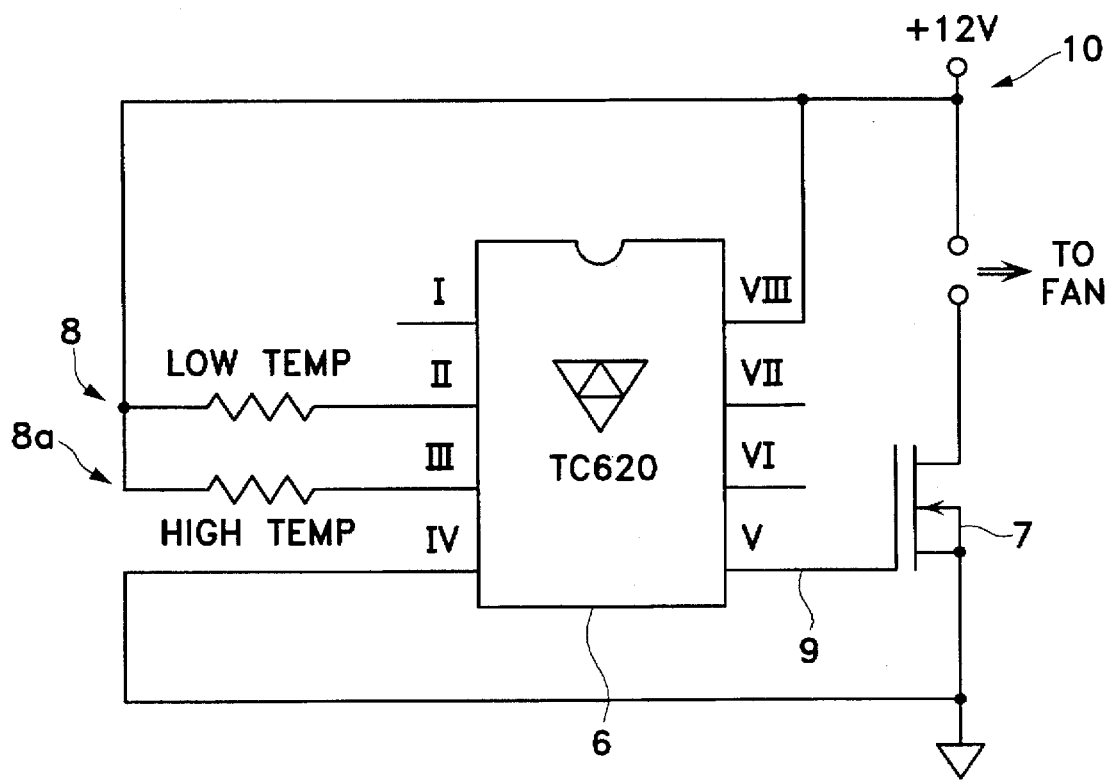
FIG. 2 is a schematic presentation of a thermal control circuit of a temperature controlled fan driver.

Referring to FIG. 2, thermal control circuits of the TCFD 4 are schematically illustrated. The TCFD 4 comprises a solid state temperature sensor 6, a fan power driver 7, a pair of temperature programming resistors designated respectively as LOW SET resistor 8, and HIGH SET resistor 8a, a power drive output 9, and a power supply source, +12 v, 10.

Figure 3:
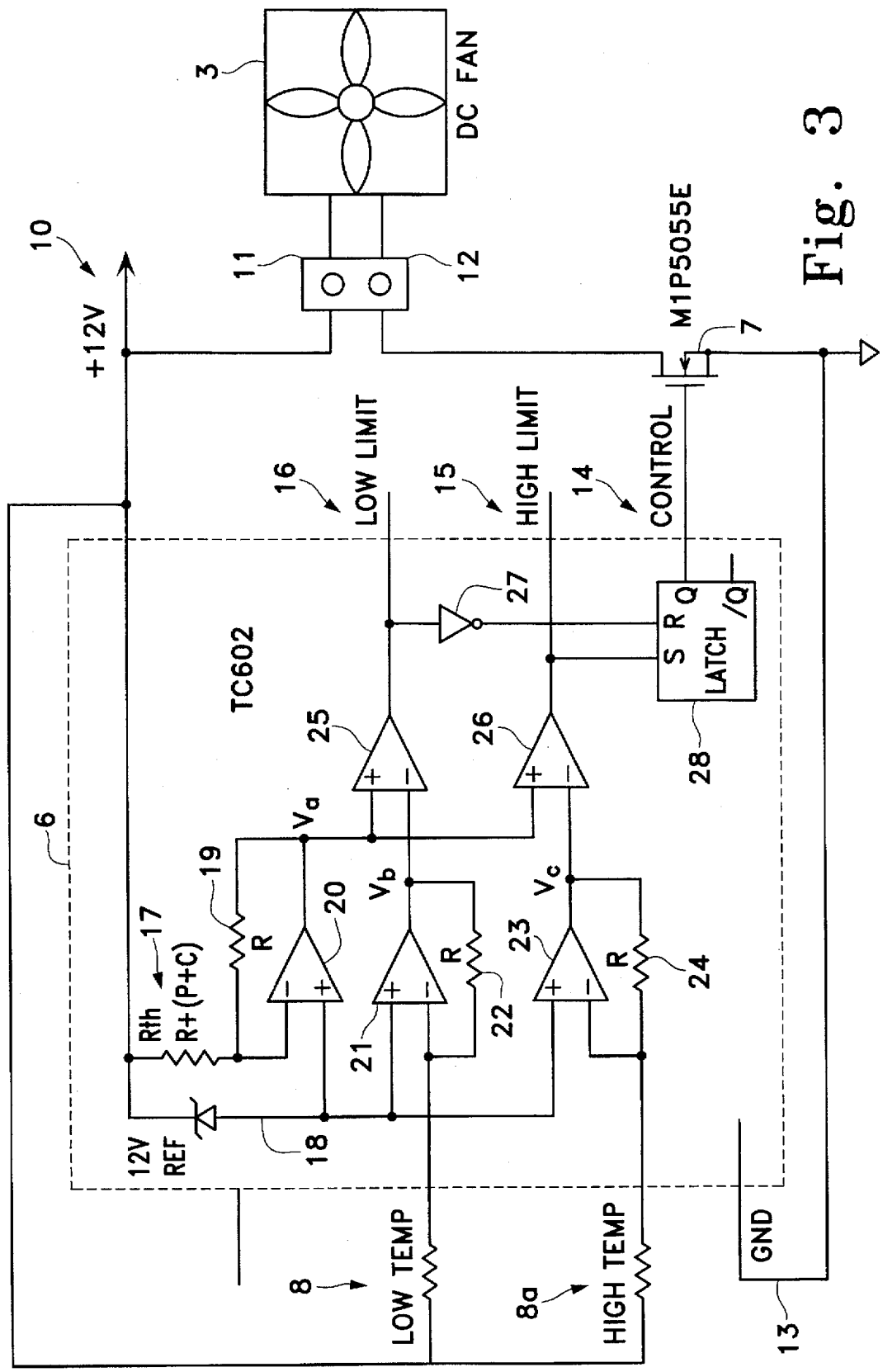
FIG. 3 is a block diagram of the circuits of the a temperature controlled fan driver.

Referring now to FIG. 3, an electrical connection of the TCFD 4 with the backup fan 3 is shown. The backup fan 3 may be a standard two-wire DC fan having a positive terminal 11 and a negative terminal 12 through which the backup fan 3 is made connected with the TCFD 4. The solid state temperature sensor 6 may be a programmable solid state temperature switch designed to replace conventional mechanical switches in temperature sensing and control system. For the purposes of illustration, a preferred solid state temperature sensor designated as "TC620" is described. The TC620 has eight pins namely, I, II, III, IV, V, VI, VII and VIII, through the interaction of which with other functions of the TCFD 4, the TC620 can perform a variety of temperature sensing and control functions. As shown in FIGS. 2 and 3, the pin I is not in use. The pin II connects to one end of the LOW SET resistor 8. The pin III connects to one end of the HIGH SET resistor 8a. The pin IV connects to a ground GND 13 and to the source of the fan power driver 7. For the purposes of illustration, a preferred fan power driver designated as "mTP3055E" will be described. The pin V outputs a CONTROL signal 14 and is also connected with the gate of the fan power driver MTP3055E 7. The pin VI outputs a HIGH LIMIT signal 15. The pin VII outputs a LOW LIMIT signal 16. The pin VIII connects to the +12 V power supply source 10 and also to the positive terminal 11 of the backup fan 3 and the other end of the LOW SET resistor 8 as well as the other end of the HIGH SET resistor 8a. The negative terminal 12 of the backup fan 3 connects to the drain of the fan power driver MTP3055E 7.

It should be noted that the TC620 is able to perform its functions for temperature sensing and control at a variety of temperature ranges defined by a variety of pre-set low temperatures and pre-set high temperatures of the TC620. Preferably, the pre-set low temperature is around 45° C. and the pre-set high temperature may be around 50°–70° C. It is critical to set the pre-set low temperature always lower than the pre-set high temperature to insure the proper operation of the temperature controlled fan driver 4.

The detailed circuits of the TC620 6 are now described in accordance with FIG. 3. The TC620 incorporates an on-board positive-temperature-coefficient (PTC) thermal sensor 17 which reacts to an internal temperature of the die. Additionally, the TC620 6 further comprises one Zener diode 18 used with reverse bias having an Vz of 1.2 V, three (3) resistors, 19, 22 and 24, five (5) operational amplifiers (hereinafter referred to as "Op amp"), 20, 21, 23, 25 and 26, one invertor 27 and one RS ("reset/set") flip-flop 28. One end of the thermal sensor 17 connects with the pin VIII and with the "n" end of the Zener diode 18, the other end of thermal sensor 17 connects with the resistor 19 and with an inverting input of the Op amp 20. The "p" end of the Zener diode 18 connects respectively with a noninverting input of the Op amp 20, 21 and 22. The other end of the resistor 19 connects with an output of the Op amp 20 and a noninverting input of the Op amp 25 and 26. An inverting input of the Op amp 21 connects with the pin II and one end of the resistor 22. The other end of the resistor 22 connects with an output of the Op amp 21 and with an inverting input of the Op amp 25. An inverting input of the Op amp 23 connects with the pin III and with one end of the resistor 24. The other end of the resistor 24 connects with an output of the Op amp 23 and with an inverting input of the Op amp 26. An output of the Op amp 25 connects with an input of the inverter 27 and the pin VII. An output of the Op amp 26 connects with an input S of the RS flip-flop 28 and the pin VII. An output of the inverter 27 connects with an input R of the RS flip-flop. An output Q of the RS flip-flop 28 connects with the pin V.

As shown in FIG. 3, the output voltage of the Op amp 20, Va, is given as:

$$Va = (12V - Vz) - (R/Rth) \times Vz$$
$$= (12V - 1.2V) - (R/Rth) \times 1.2V$$
$$= 10.8V - (R/Rth) \times 1.2V$$

where Rth is the resistance of the thermal resistor 17, Vz is a reverse voltage of the Zener diode 18, R is the resistance of the resistor 19. Also, the output voltages of the Op amp 21 and 23, Vb and Vc, are:

Vb=10.8 V—(R/Plow)×1.2 V
Vc=10.8 V—(R/Rhigh)×1.2 V where Plow is the resistance of the LOW LIMIT resistor 8, Rhigh is the resistance of the HIGH LIMIT resistor 8a.

Accordingly, when the ambient temperature around the temperature switch, TC620 6, is below the pre-set low temperature, i.e., Rth<Rlow, which will result in Va<Vb, the Op amp 25 functions as a comparator so that the output of the Op amp 25 is LOW. When the temperature rises above the pre-set low temperature, Rth>Rlow, which will result in Va>Vb, the output of the Op amp 25 is HIGH.

When the ambient temperature around the temperature switch, TC620 6, is below the pre-set high temperature, Rth<Rhigh, which will give rise to Va<Vc, the Op amp 26 functions as a comparator so that the output of the Op amp 26 is LOW. When the temperature rises above the pre-set high temperature, Rth>Rhigh, which will give rise to Va>Vc, the output of the Op amp 26 is HIGH.

It is further noted that, after the pre-set low temperature and the pre-set high temperature have been decided, the resistance value for the LOW SET resistor 8 and the HIGH SET resistor 8a can be determined by inserting the desired trip temperature (T) into the following formula:

R=0.5997×T

Where R is the value in Ohms of a programming resistor, T is the desired trip temperature in degrees Kelvin. For the purposes of illustration without limitation, to program the pre-set low temperature at 50° C., the value for the LOW SET resistor 8 would be:

Rlow=0.5997×(50+273.15)$^{2.1312}$=133,652 Ohms

Figure 5:
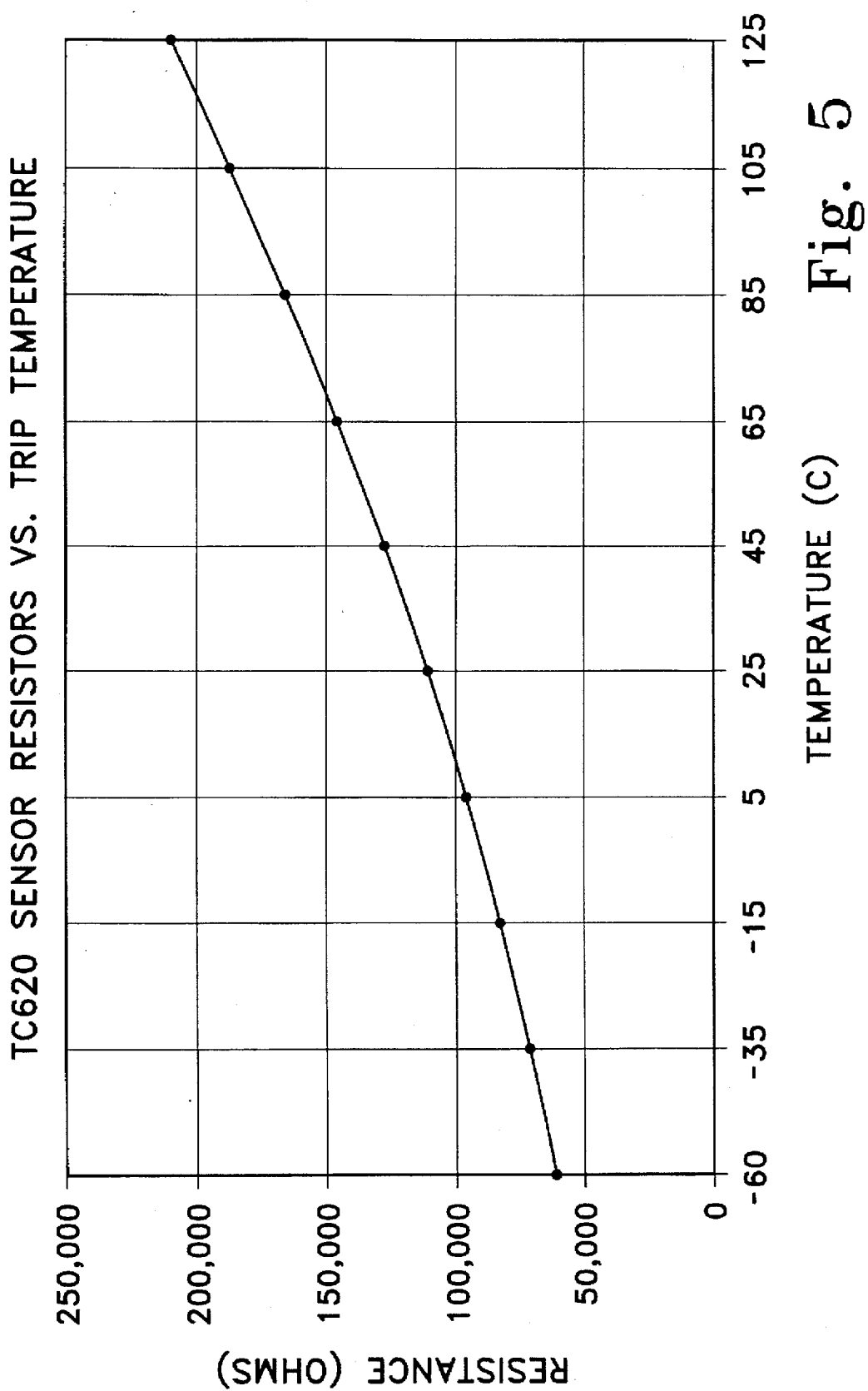
FIG. 5 shows the relationship of trip temperature and the resistance of a solid state temperature sensor.

The relationship of the trip temperature and the resistance of the PTC thermal sensor 17 is further illustrated in FIG. 5.

Figure 4:
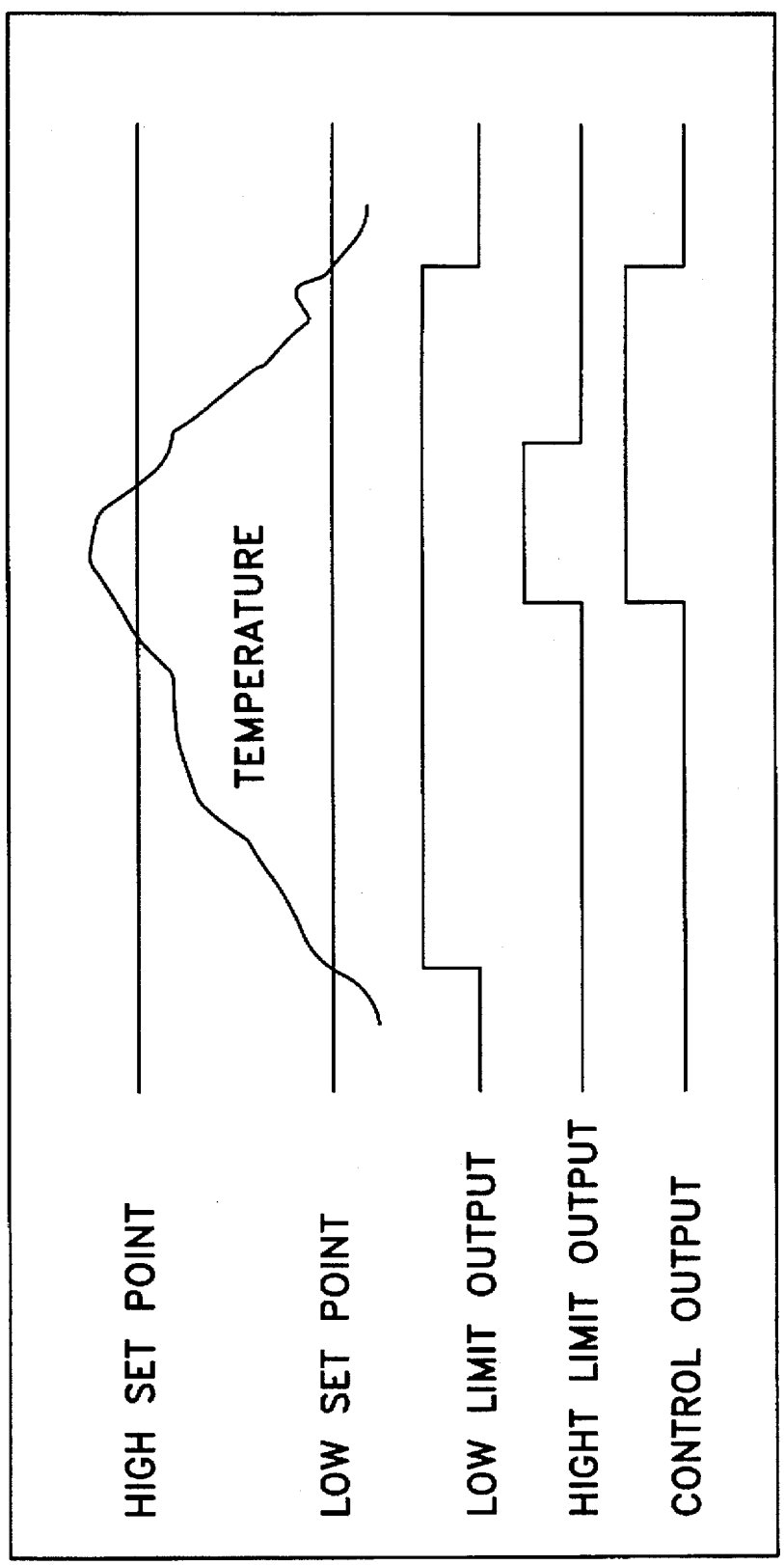
FIG. 4 shows the relationship of the ambient temperature and the various control output signals with respect to the turning on/off of the backup fan.

Referring back to FIG. 4, the relationship between the ambient temperature and the output logic provided by the TFCD 4 with respect to the activation of the backup fan 3 is now described. When the ambient temperature around the temperature switch, TC620 6, is below the pre-set low point, preferably around 45° C., both the signals from the LOW LIMIT OUTPUT and the HIGH LIMIT OUTPUT remain low, the input R through the inverter 27 is high to reset the RS flip-flop 28, giving rise to a LOW signal of the CONTROL OUTPUT. As a result, the fan power driver MTP3055E 7 is in an inactive state and the backup fan 3 is off. When the ambient temperature around temperature switch, TC620 6, is above the pre-set low temperature but below the pre-set high temperature, preferably between 50°–70° C., the signal from the LOW LIMIT OUTPUT is high while the signal from the HIGH LIMIT OUTPUT remains low, the output of the RS flip-flop 28 remains unchanged, giving rise to a low CONTROL OUTPUT signal. Consequently, the fan power driver MTP3055E 7 remains in an inactive state and the backup fan 3 is off. When the ambient temperature around the temperature switch, TC620 6, is above the pre-set high temperature, the signals from both the LOW LIMIT OUTPUT and the HIGH LIMIT OUTPUT are high to set the RS flip-flop 28, giving rise to a high CONTROL OUTPUT signal. As a result of such changes, the fan power driver MTP3055E 7 is activated to turn the backup fan 3 on. When the ambient temperature around temperature switch, TC620 6, drops back below the pre-set high temperature but above the pre-set low temperature, the signal from the LOW LIMIT OUTPUT remains high while the signal from the HIGH LIMIT OUTPUT switches to low, the output of the RS flip-flop 28 is unchanged which gives rise to a high CONTROL OUTPUT signal. As a result, the fan power driver MTP3055E 7 is in an active state which keeps the backup fan 3 remaining on. When the ambient temperature around the temperature switch, TC620 6, drops back below the pre-set low temperature, the signals from both the LOW LIMIT OUTPUT and the HIGH LIMIT OUTPUT remain low which will reset the RS flip-flop 28 and gives rise to a low CONTROL OUTPUT signal, and, consequently, the fan power driver MTP3055E 7 is back to an inactive state to turn the backup fan 3 off.

In view of foregoing, the advantages of having a power supply system having a dual cooling fan system for an electronic device or a computer system become readily apparent as set forth in the present invention. The regular fan 2 draws hot air out of the power supply system 1 while the power supply system 1 is in normal operation under an ambient temperature below the pre-set low temperature. When the temperature of the power supply system 1 is between a pre-set low temperature and a pre-set high temperature, the regular fan 2 is sufficient to cool the computer system under the circumstances. However, when the temperature of the computer system 1 exceeds the pre-set high temperature, the temperature controlled fan driver 4 will immediately sense the temperature increases and send a CONTROL signal to the fan power driver 7 to turn on the backup fan 3. Thus, the join actions of the backup fan 3 and the regular fan 2 will create a much better and quicker air flow to rapidly decrease the temperature of the power supply system 1 of an electronic device or a computer system to prevent IC overheating. Once the temperature of the electronic device or the computer system falls below the pre-set low temperature, the temperature controlled fan driver 4 will turn off the backup fan 3 to reduce power consumption. The present invention therefore provides a smart power supply which has the capability of detecting the changes in the ambient temperature and making proper responses to such changes by turning on a backup fan, allowing the cooling system of an electronic device or a computer to operate in a redundant manner.

Various modifications and alterations of this invention will become apparent to those skilled in the art without departing from the scope and spirit of this invention, and it should be understood that this invention is not to be unduly limited to the illustrative embodiment set forth herein.

What is claimed is:

1. A power supply system for providing air flow control and heat reduction in an electronic device having a regular fan, said power supply system comprises an additional backup fan operating independently from said regular fan, comprising:

a thermal control circuit comprising
   (a) a solid state temperature sensor for detecting ambient temperature changes inside said electronic device;
   (b) a fan power drive electrically connected to said solid state temperature sensor and to said backup fan to turn on or off said backup fan in response to said ambient temperature changes;
   (c) a pair of resistors connected respectively to said solid state temperature sensor to set a low and a high trigger temperatures based on which said backup fan makes a proper response in accordance with said ambient temperature changes wherein said high trigger temperature shall be higher than said low trigger temperature; and
   an voltage source to provide voltage for said backup fan.

2. A power supply system of claim 1 wherein said backup fan is a standard two-wire DC fan.

3. A power supply system of claim 1 wherein said pair of resistors are programmable in accordance with said ambient temperature of the electronic device.

4. A power supply of claim 1 wherein said solid state temperature sensor further comprises an on-board positive temperature coefficient thermal sensor for detecting an internal temperature change of a die inside the electronic device.

5. A power supply of claim 1 wherein said solid state temperature sensor preferably is the one designated as TC620.

6. A power supply system of claim 1 wherein said fan power drive preferably is the one designated as MTP3055E.

7. A power supply system of claim 1 wherein said lower trigger temperature is 45° C.

8. A power supply system of claim 1 wherein said high trigger temperature has a range between 50° and 70° C.

9. A power supply system of claim 1 wherein said electronic device is a computer system.

10. A thermal control circuit of a power supply system for controlling the operation of a fan in an electronic device responding to ambient temperature changes, comprising:

a solid state temperature sensor for detecting ambient temperature changes inside said electronic device;
   a fan power drive electrically connected to said solid state temperature sensor and to said fan to turn on or off said fan in response to said ambient temperature changes; and
   a pair of resistors connected respectively to said solid state temperature sensor to set a low and a high trigger temperatures based on which said fan makes a proper response in accordance with said ambient temperature changes wherein said high trigger temperature shall be higher than the low trigger temperature.

11. A thermal control circuit of claim 11 wherein said solid state temperature sensor may further comprise an on-board positive temperature coefficient thermal sensor for detecting an internal temperature change of a die inside the electronic device.

12. A thermal control circuit of claim 11 wherein said pair of resistors are programmable in accordance with said ambient temperature of a computer.

13. A thermal control circuit of claim 11 wherein said lower trigger temperature is 45° C.

14. A thermal control circuit of claim 11 wherein said high trigger temperature has a range between 50° and 70° C.

15. A method for reducing heat buildup inside an electronic device having a regular fan, comprising the steps of:

installing a backup fan on a circuit board of the electronic device to provide for an additional air flow to prevent heat buildup;

connecting said backup fan with a thermal control circuit comprising a solid state temperature sensor for detecting ambient temperature changes inside said electronic device;

electrically connecting a fan power drive to said solid state temperature sensor and to said backup fan to turn on or off said backup fan in response to said ambient temperature changes;

providing a pair of resistors connected respectively to said solid state temperature sensor to set a low and a high trigger temperatures based on which said fan power drive will be activated or deactivated to turn on or off said backup fan in accordance with said ambient temperature changes wherein said high trigger temperature shall be higher than the low trigger temperature.

16. A method for reducing heat buildup inside an electronic device of claim 15 further comprises the step of connecting an on-board positive temperature coefficient thermal sensor to said solid state temperature sensor for detecting an internal temperature change of a die inside the electronic device.

* * * * *